(12) United States Patent
Kim et al.

(10) Patent No.: US 9,748,282 B2
(45) Date of Patent: Aug. 29, 2017

(54) THIN FILM TRANSISTOR ARRAY SUBSTRATE HAVING A GATE ELECTRODE COMPRISING TWO CONDUCTIVE LAYERS

(71) Applicant: Samsung Display Co., Ltd., Yongin (KR)

(72) Inventors: Myounghwa Kim, Yongin (KR); Jaewook Kang, Yongin (KR); Joohee Jeon, Yongin (KR); Jongchan Lee, Yongin (KR); Yoonho Khang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/721,505

(22) Filed: May 26, 2015

(65) Prior Publication Data

US 2016/0064425 A1    Mar. 3, 2016

(30) Foreign Application Priority Data

Aug. 29, 2014    (KR) .......................... 10-2014-0114515

(51) Int. Cl.
| | |
|---|---|
| *H01L 27/12* | (2006.01) |
| *H01L 29/786* | (2006.01) |
| *H01L 29/423* | (2006.01) |
| *H01L 29/49* | (2006.01) |
| *H01L 29/45* | (2006.01) |

(Continued)

(52) U.S. Cl.
CPC ........ *H01L 27/1255* (2013.01); *G02F 1/1368* (2013.01); *H01L 27/1222* (2013.01);
(Continued)

(58) Field of Classification Search
CPC . H01L 27/1214; H01L 27/1255; H01L 27/33; H01L 29/78675
(Continued)

(56) References Cited

U.S. PATENT DOCUMENTS 6,469,317 B1 * 10/2002 Yamazaki ......... H01L 29/78621
                                                                257/288
7,256,060 B2 * 8/2007 Park .................. G02F 1/133512
                                                                257/E33.071

(Continued)

FOREIGN PATENT DOCUMENTS

KR    10-2012-0140474    12/2012
KR    10-2013-00510813    5/2013
(Continued)

*Primary Examiner* — Anh Mai
(74) *Attorney, Agent, or Firm* — H.C. Park & Associates, PLC

(57) ABSTRACT

Provided is a thin film transistor array substrate having at least one thin film transistor. The thin film transistor includes a semiconductor layer having a channel area with a first doping concentration on a substrate, a source-drain area disposed at opposite sides of the channel area and with a second doping concentration greater than the first doping concentration, and a substantially undoped area extending from the source-drain area. The substrate has a gate insulating layer on the semiconductor layer and a gate electrode disposed on the gate insulating layer and overlapping the channel area in at least some portions. The substrate has a source electrode and a drain electrode, each insulated from the gate electrode and electrically connected to the source-drain area. The gate electrode includes a first gate electrode layer and a second gate electrode layer, wherein the second gate electrode layer is thicker than the first gate electrode layer.

10 Claims, 5 Drawing Sheets

(51) Int. Cl.
*G02F 1/1368* (2006.01)
*H01L 27/32* (2006.01)
*G02F 1/1362* (2006.01)

(52) U.S. Cl.
CPC .... *H01L 27/1288* (2013.01); *H01L 29/42372* (2013.01); *H01L 29/42384* (2013.01); *H01L 29/458* (2013.01); *H01L 29/4908* (2013.01); *H01L 29/4966* (2013.01); *H01L 29/78666* (2013.01); *H01L 29/78675* (2013.01); *G02F 1/136213* (2013.01); *H01L 27/3258* (2013.01); *H01L 27/3262* (2013.01); *H01L 27/3265* (2013.01); *H01L 2227/323* (2013.01)

(58) Field of Classification Search
USPC ......................................................... 257/288
See application file for complete search history.

(56) References Cited

U.S. PATENT DOCUMENTS

| | | |
|---|---|---|
| 2012/0326174 A1 | 12/2012 | Park et al. |
| 2013/0119388 A1 | 5/2013 | Lee et al. |
| 2013/0134423 A1* | 5/2013 | Jin ........................ H01L 27/326 257/59 |
| 2013/0299784 A1 | 11/2013 | Jin et al. |
| 2014/0084264 A1 | 3/2014 | Lee |

FOREIGN PATENT DOCUMENTS

| | | |
|---|---|---|
| KR | 10-2013-0058409 | 6/2013 |
| KR | 10-2013-0125240 | 11/2013 |
| KR | 10-2014-0039840 | 4/2014 |

\* cited by examiner

THIN FILM TRANSISTOR ARRAY SUBSTRATE HAVING A GATE ELECTRODE COMPRISING TWO CONDUCTIVE LAYERS

CROSS-REFERENCE TO RELATED APPLICATION

This application claims the benefit of Korean Patent Application No. 10-2014-0114515, filed on Aug. 29, 2014, which is incorporated by reference for all purposes as if fully set forth herein.

BACKGROUND

Field

Exemplary embodiments relate to a thin film transistor array substrate and a method of manufacturing the same.

Discussion

A flat panel display apparatus such as an organic light emitting display apparatus or a liquid crystal display (LCD) apparatus includes a thin film transistor (TFT), a capacitor, and wiring connecting these elements.

A substrate on which a flat panel display apparatus is manufactured includes TFTs, capacitors, and minute wiring patterns, and the minute wiring patterns of the substrate are typically formed using a photolithography method in which patterns are transferred using a mask.

According to the photolithography method, a substrate on which patterns are to be formed is coated uniformly with a photoresist, and the photoresist is exposed using an exposure apparatus such as a stepper, and then the photosensitized photoresist is developed. After developing the photoresist, patterns on the substrate are etched using the remaining photoresist as a mask, and then unnecessary portions of the photoresist are removed after forming the patterns.

A process that uses a mask to transfer a pattern requires preparation of the pattern on the mask. Therefore, when the process has multiple masking steps, the manufacturing cost of the flat panel display apparatus increases, including with regard to the costs associated with preparing the masks.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor array substrate having low resistance wiring, and a manufacturing method for the thin film transistor array substrate.

Additional aspects will be set forth in part in the description which follows and, in part, will be apparent from the description, or may be learned by practice of the presented embodiments.

According to one or more exemplary embodiments, a thin film transistor array substrate includes at least one thin film transistor having a semiconductor layer comprising a channel area having a first doping concentration on a substrate, a source-drain area disposed at opposite sides of the channel area and has a second doping concentration greater than the first doping concentration, and a substantially undoped area extending from the source-drain area; a gate insulating layer on the semiconductor layer; a gate electrode disposed on the gate insulating layer and overlapping the channel area in at least some portions; and a source electrode and a drain electrode, each insulated from the gate electrode and electrically connected to the source-drain area, wherein the gate electrode comprises a first gate electrode layer and a second gate electrode layer, wherein the second gate electrode layer is thicker than the first gate electrode layer.

According to one or more exemplary embodiments, a method of manufacturing a thin film transistor array substrate is described, the method comprising forming a substantially undoped semiconductor layer on an entire surface of a substrate; forming a gate insulating layer on the substantially undoped semiconductor layer; forming a preliminary-gate electrode comprising a first gate electrode layer and an upper gate electrode layer of a thin film transistor on the gate insulating layer; forming an interlayer insulating layer comprising an opening that exposes an area corresponding to a channel area and a source-drain area of the thin film transistor; performing a first doping process to form the source-drain area in portions of the substantially undoped semiconductor layer; etching the upper gate electrode layer; performing a second doping process to form the channel area in a channel portion of the undoped semiconductor layer; performing a dopant activation annealing; and forming a source electrode connected to the source-drain area, a drain electrode connected to the source-drain area, and a second gate electrode layer, the second gate electrode layer being formed on the first gate electrode layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
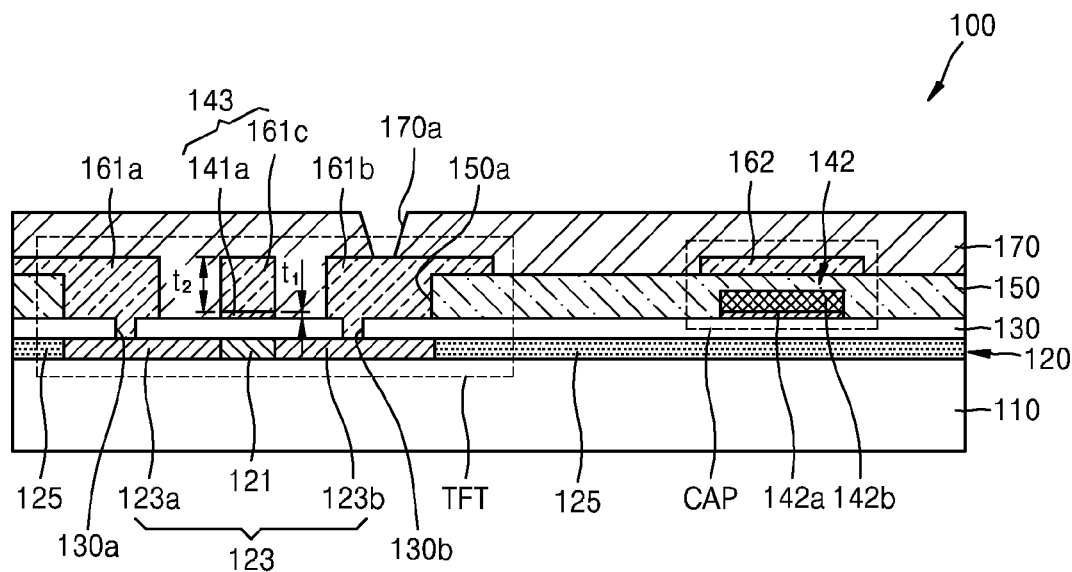
FIG. 1 is a cross-sectional view of a thin film transistor array substrate according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view of a thin film transistor array substrate according to according to one of more exemplary embodiments.

Hereinafter, thin film transistor array substrate 100 includes a case in which a plurality of thin film transistors TFTs are regularly arranged; a case in which a plurality of thin film transistors TFTs are irregularly arranged; or a case in which only one thin film transistor TFT is disposed thereon.

Referring to FIG. 1, thin film transistor array substrate 100 includes at least one thin film transistor TFT, and the thin film transistor TFT includes semiconductor layer 120, gate insulating layer 130, gate electrode 143, source electrode 161a, and drain electrode 161b.

Semiconductor layer 120 includes channel area 121 having a channel doping concentration, source-drain area 123 that is disposed at opposite sides of channel area 121 and has a source-drain doping concentration, and undoped areas 125 extended from source-drain area 123. The channel doping concentration may be lower than the source-drain doping concentration. In some embodiments, the channel doping concentration may be $10^2$ to $10^4$ times lower than the source-drain doping concentration. In some embodiments, the channel doping concentration may be in a range of about $1E12/cm^3$ (i.e., $1 \times 10^{12}$ atoms/$cm^3$) to about $5E12/cm^3$, and the source-drain doping concentration may be in a range of about $1E15/cm^3$ to about $5E15/cm^3$.

Channel area 121 may be doped to control a threshold voltage of the thin film transistor TFT, and the conductivity types of channel area 121 and source-drain area 123 may be identical to or different from each other. For example, source-drain area 123 may be a p-type semiconductor, and channel area 121 may be an n-type semiconductor. In some embodiments, the conductivity types of source-drain area 123 and channel area 121 may be identical but the concentrations thereof may be different.

Also, thin film transistor array substrate 100 may further include a capacitor CAP having lower electrode 142 formed on the same layer as the layer on which gate electrode 143 is formed and having an upper electrode 162 insulated from lower electrode 142.

In addition, thin film transistor array substrate 100 may further include interlayer insulating layer 150 and/or planarization layer 170.

Substrate 110 may be formed of a glass material, a plastic material, or a metal material. Substrate 110 may be a flexible substrate. A buffer layer (not shown) may be formed on substrate 110. The buffer layer may provide a planar surface on the upper portion of substrate 110, and may include an insulating material to prevent external moisture and foreign materials from infiltrating through substrate 110. The buffer layer may be omitted, if desired.

The thin film transistor TFT is provided on substrate 110. The thin film transistor TFT includes semiconductor layer 120, gate electrode 143, source electrode 161a, and drain electrode 161b.

The semiconductor layer 120 may be formed of semiconductor including amorphous silicon or crystalline silicon. The semiconductor layer 120 may include channel area 121 that has the channel doping concentration, and source-drain area 123 that is disposed at opposite sides of channel area 121 and has the source-drain doping concentration, which is greater than the channel doping concentration. The source-drain area 123 includes source area 123a and drain area 123b that are disposed at opposite ends of channel area 121. The source-drain area 123 and channel area 121 may have conductivity depending on a dopant added thereto. For example, when a Group III dopant such as boron (B) is added to one of the areas, it may have a p-type conductivity, and when a Group V dopant such as phosphorus (P), arsenic (As), and antimony (Sb) is added to one of the areas, it may have a n-type conductivity.

Also, semiconductor layer 120 may include undoped areas 125 extending from source-drain area 123. Undoped area 125 refers to an area that is not doped, or doped at a very low concentration compared to source-drain area 123 and channel area 121, and may be disposed to surround channel area 121 and source-drain area 123. Undoped area 125 has an insulating property, and thus the thin film transistor TFT may be electrically separated from other adjacent devices. Interlayer insulating layer 150 that corresponds to undoped area 125 may be disposed above the upper portion of undoped area 125.

Semiconductor layer 120 may be formed on an entire surface of substrate 110. Also, in one or more exemplary embodiments, semiconductor layer 120 is not patterned by an additional mask process. In this regard, the number of masks used during the process can be reduced, and thus the manufacturing cost may be reduced and the manufacturing process may be simplified.

Gate electrode 143 is disposed at a position corresponding to channel area 121 of semiconductor layer 120 while gate insulating layer 130 is disposed between gate electrode 143 and channel area 121.

Gate insulating layer 130 may be provided on semiconductor layer 120, and may include first contact hole 130a and second contact hole 130b that respectively expose source area 123a and drain area 123b. Gate insulating layer 130 may be formed of an insulating material and may electrically disconnect semiconductor layer 120 and gate electrode 143. In some embodiments, gate insulating layer 130 may be formed of an inorganic material or an organic material in a single-layer structure of a stack structure including these materials. In some embodiments, gate insulating layer 130 may include silicon nitride (SiNx) and/or silicon oxide (SiOx).

Gate electrode 143 may include first gate electrode layer 141a having a thickness t1, and second gate electrode layer 161c having a thickness t2 that is greater than the thickness t1 of first gate electrode layer 141a. The thickness t2 of second gate electrode layer 161c may be about 3 to 5 times greater than the thickness t1 of first gate electrode layer 141a. In some embodiments, the thickness of first gate electrode layer 141a may be in a range of about 300 Å to about 500 Å, and the thickness t2 of second gate electrode layer 161c may be in a range of about 1,000 Å to about 20,000 Å. First gate electrode layer 141a may be formed of a material and in a thickness that allows dopant to pass through first gate electrode layer 141a in order to dope channel area 121. In some embodiments, first gate electrode layer 141a may be formed of a transparent conductive material. For example, first gate electrode layer 141a may be formed of indium tin oxide (ITO), indium zinc oxide (IZO), zinc oxide (ZnO), indium oxide ($In_2O_3$) or the like. In some embodiments, the thickness of first gate electrode layer 141a may be in a range of about 300 Å to about 500 Å. However, the thickness is not limited thereto, and the thickness of first gate electrode layer 141a may be determined after considering the concentration and the feed rate of the dopant for doping of channel area 121.

If gate electrode 143 is formed exclusively with first gate electrode layer 141a having a thin thickness t1, voltage drop (IR-Drop) applied to gate electrode 143 may be exacerbated as thin film transistor array substrate 100 becomes greater. Second gate electrode layer 161c is provided to prevent or reduce such an IR-Drop and may be formed in the thickness t2 that is greater than the thickness t1 of first gate electrode layer 141a.

Second gate electrode layer 161c may be formed of the same material as source electrode 161a or drain electrode 161b. Second gate electrode layer 161c may be formed including Al, Mo, Ti, Cu, and the like. In some embodiments, second gate electrode layer 161c may be formed in a stack structure of Ti/Cu, Mo/Al/Mo, Mo/AlGe/Mo, or Ti/Al/Ti. In some embodiments, the thickness t2 of second gate electrode layer 161c may be in a range of about 1,000 Å to about 20,000 Å.

Source electrode 161a and drain electrode 161b may be disposed to be spaced apart from gate electrode 143 on gate insulating layer 130. Portions of interlayer insulating layer 150 may further be disposed between at least portions of gate insulating layer 130 and at least portions of source electrode 161a and drain electrode 161b. Source electrode 161a may be connected to source area 123a through first contact hole 130a of gate insulating layer 130. Drain electrode 161b may be connected to drain area 123b through second contact hole 130b of gate insulating layer 130.

Source electrode 161a and drain electrode 161b may be simultaneously formed of the identical material. Also, source electrode 161a and/or drain electrode 161b may be formed of the same material as that of second gate electrode layer 161c and upper electrode 162 of a capacitor CAP. Source electrode 161a and drain electrode 161b may be formed including Al, Mo, Ti, Cu, and the like. In some embodiments, source electrode 161a and drain electrode 161b may be formed in a stack structure of Ti/Cu, Mo/Al/Mo, or Ti/Al/Ti. In some embodiments, the thickness of source electrode 161a and drain electrode 161b may be about 1,000 Å or more.

Capacitor CAP may include lower electrode 142 that may be disposed above semiconductor layer 120 in a region corresponding to an undoped area 125 of the thin film transistor TFT. Capacitor CAP may also include upper electrode 162 that may be insulated from lower electrode 142 and overlap with lower electrode 142 in at least some portions.

Lower electrode 142 may be formed on the same layer as gate electrode 143. In some embodiments, lower electrode 142 may include first electrode layer 142a and second electrode layer 142b. Here, first electrode layer 142a may be formed of the same material as first gate electrode layer 141a. First electrode layer 142a may have substantially the same thickness as first gate electrode layer 141a. First electrode layer 142a may be formed of a transparent conductive material. For example, first electrode layer 142a may be formed of ITO, IZO, ZnO, $In_2O_3$, or the like.

The second electrode layer 142b may be thicker than the first electrode layer 142a. Second electrode layer 142b may be formed of the same material as source electrode 161a or drain electrode 161b. Second electrode layer 142b may be formed including Al, Mo, Ti, Cu and the like. In some embodiments, second electrode layer 142b may be formed in a stack structure of Ti/Cu, Mo/Al/Mo, Mo/AlGe/Mo, or Ti/Al/Ti.

Upper electrode 162 may be insulated from lower electrode 142 by portions of interlayer insulating layer 150 and upper electrode 162 may overlap at least partially with lower electrode 142. Upper electrode 162 may be formed of the same material as source electrode 161a or drain electrode 161b. Upper electrode 162 may be formed including Al, Mo, Ti, Cu and the like. In some embodiments, upper electrode 162 may be formed in a stack structure of Ti/Cu, Mo/Al/Mo, Mo/AlGe/Mo, or Ti/Al/Ti.

Portions of interlayer insulating layer 150 may be interposed between lower electrode 142 and upper electrode 162 and serve as a dielectric to determine the capacitance of the capacitor CAP. Interlayer insulating layer 150 may be formed of various insulating materials. For example, interlayer insulating layer 150 may be formed of an organic material as well as an inorganic material such as oxide, nitride. In some embodiments, interlayer insulating layer 150 may be formed of an organic material or an inorganic material in a single-layer structure or a stack structure including these materials. Interlayer insulating layer 150 may be formed corresponding to undoped area 125 of semiconductor layer 120. Interlayer insulating layer 150 may serve as a mask that prevents dopant from being implanted into undoped area 125 in a first doping process and a second doping process, which are both described later.

Planarization layer 170 may be provided on the thin film transistor TFT and/or the capacitor CAP. Planarization layer 170 may be formed of an insulating material, and of an inorganic material, an organic material, or a composite of an organic material and an inorganic material in a single-layer structure or a stack structure. In some embodiments, planarization layer 170 may be made of an organic material. In a case in which planarization layer 170 is formed of an organic material, the thickness of planarization layer 170 may be greater than that in a case of being formed of an inorganic material, thereby reducing a parasitic capacitance. In some embodiments, planarization layer 170 may have a planar surface by coating the surface with polyacrylate, polyimides, benzocyclobutene (BCB) or the like, and the thickness thereof may be in a range of about 3 μm to about 5 μm. Planarization layer 170 may include opening 170a that exposes some portions of source electrode 161a or drain electrode 161b. The thin film transistor TFT may be electrically connected to other devices or wirings through opening 170a.

FIGS. 2A through 2F are cross-sectional views showing the sequence of a manufacturing process of the thin film transistor array substrate according to one or more exemplary embodiments.

Figure 2A:
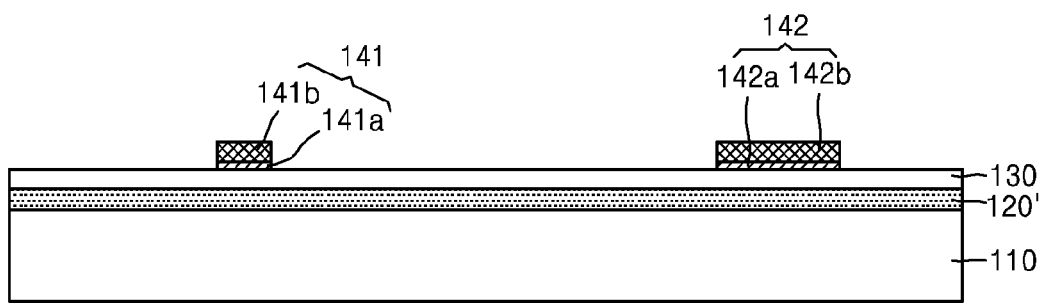
FIGS. 2A, 2B, 2C, 2D, 2E, and 2F are cross-sectional views showing the sequence of a manufacturing process of the thin film transistor array substrate according to one of more exemplary embodiments.

Referring to FIG. 2A, undoped-semiconductor layer 120', gate insulating layer 130, and a first conductive film (at least a portion of which will become preliminary-gate electrode 141 and lower electrode 142) may be formed on substrate 110 in sequence. The first conductive film is patterned to form preliminary-gate electrode 141 and lower electrode 142 of the capacitor CAP, as described below.

To provide more detail, undoped-semiconductor layer 120' may be formed on the entire surface of substrate 110. Undoped-semiconductor layer 120' includes a semiconductor layer that is not artificially doped and is formed of one or more semiconductor material(s) having an insulating property. Undoped-semiconductor layer 120' may be formed of a semiconductor including amorphous silicon or crystalline silicon, and be deposited by using various methods. Here, crystalline silicon may be formed by crystallizing amorphous silicon. Amorphous silicon may be crystallized by using various methods such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

A buffer layer (not shown) may be deposited between substrate 110 and undoped-semiconductor layer 120'. The buffer layer may be formed of an insulating material and be deposited by using various methods. The buffer layer may be omitted, if desired.

According to embodiments of the present invention, undoped-semiconductor layer 120' is not patterned by a mask. Accordingly, mask-related costs may be reduced, and the process may be simplified, thereby reducing processing time.

Gate insulating layer 130 may be formed on undoped-semiconductor layer 120'. Gate insulating layer 130 may be formed of an organic or an inorganic insulating material. In some embodiments, gate insulating layer 130 may be formed of silicon nitride (SiNx), silicon oxide ($SiO_2$), hafnium (Hf) oxide, aluminum oxide, or the like. Gate insulating layer 130 may be formed by using various methods including a sputtering method, a chemical vapor deposition (CVD) method and plasma enhanced chemical vapor deposition (PECVD) method.

After forming gate insulating layer 130, a first conductive film (at least portions of which will become preliminary-gate electrode 141 and lower electrode 142) may be formed on the whole surface of gate insulating layer 130. The first conductive film may be subsequently patterned to form preliminary-gate electrode 141 and lower electrode 142 thereon through a first mask process.

The first conductive film may be formed by using various methods including a sputtering method, a CVD method and PECVD method.

In the first mask process, gate insulating layer 130 may be coated with a photoresist, with the photoresist being selectively exposed by using a first mask. A series of processes, such as developing, etching, and stripping or ashing are then performed. Etching may include wet etching, dry etching, or a combination of these.

Preliminary-gate electrode 141 may include first gate electrode layer 141a and upper gate electrode layer 141b formed on first gate electrode layer 141a. Upper gate electrode layer 141b may be used as a mask in the first doping process that will be mentioned later. Upper gate electrode layer 141b may be formed of a different material from that of first gate electrode layer 141a. Upper gate electrode layer 141b may be formed including Al, Mo, Ti, Cu, or the like. In some embodiments, upper gate electrode layer 141b may be formed in a stack structure of Ti/Cu, Mo/Al/Mo, Mo/AlGe/Mo, and Ti/Al/Ti. The thickness of upper gate electrode layer 141b may be greater than that of first gate electrode layer 141a.

Lower electrode 142 may have the same structure as preliminary-gate electrode 141. Lower electrode 142 may include first electrode layer 142a and second electrode layer 142b. First electrode layer 142a may be formed of the same material as first gate electrode layer 141a, and second electrode layer 142b may be formed of the same material as (that of) upper gate electrode layer 141b.

Figure 2B:
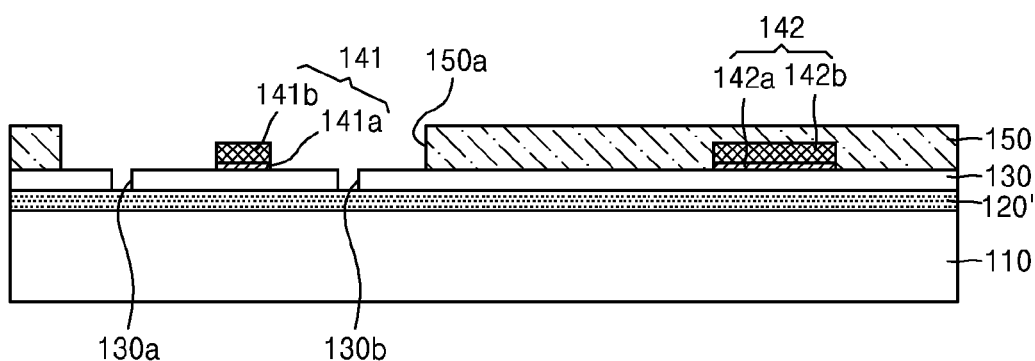

Referring to FIG. 2B, a first insulating film (at least a portion of which will become interlayer insulating layer 150) may be formed to cover the preliminary-gate electrode 141 and lower electrode 142, and opening 150a is formed to expose a part of gate insulating layer 130 at a site where the thin film transistor TFT will be formed. As a result, interlayer insulating layer 150 including opening 150a is formed thereon. Also, first contact hole 130a and second contact hole 130b are formed in gate insulating layer 130.

The first insulating film may be formed of an organic insulating material and an inorganic insulating material in a single-layer structure or a stack structure of these materials. In some embodiments, the first insulating film may be formed of silicon nitride (SiNx), silicon oxide (SiO2), hafnium (Hf) oxide, aluminum oxide, or the like. The first insulating film may be formed by using various deposition methods such as a sputtering, a CVD method, or a PECVD method.

In a second mask process, at least a portion of the first insulating film may be removed in the region of preliminary-gate electrode 141, thus forming interlayer insulating layer 150 including opening 150a. A half-tone mask may be used in the second mask process, to allow formation of first contact hole 130a and second contact hole 130b of gate insulating layer 130 during the same process time when opening 150a is formed. First contact hole 130a and second contact hole 130b may expose portions of undoped-semiconductor layer 120'.

Figure 2C:
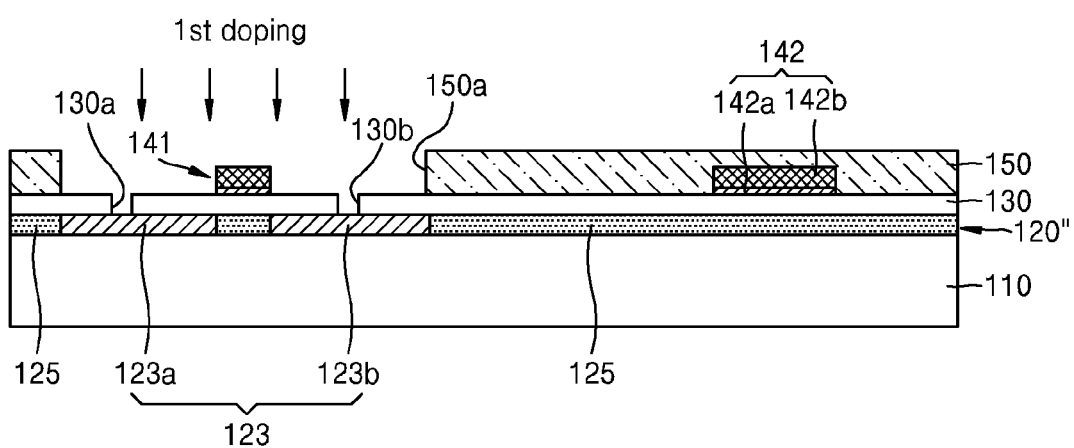

FIG. 2C depicts performance of a first doping process in which source-drain area 123 is formed in undoped-semiconductor layer 120'. By performing the first doping process, preliminary-semiconductor layer 120" including source-drain area 123, having the first doping concentration, and undoped areas 125 are formed. In the first doping process, p-type or n-type dopant ions are partially implanted into undoped-semiconductor layer 120' to form source-drain area 123.

In the first doping process, preliminary-gate electrode 141 and interlayer insulating layer 150 may serve as masks. In other words, an additional mask is not necessary to form source-drain area 123, and the insulating property of undoped areas 125 may be maintained due to effective masking by interlayer insulating layer 150.

In this case, gate insulating layer 130 may be formed of a material and in a thickness that allow the dopant to pass through gate insulating layer 130 during the first doping process. Therefore, dopant passing through gate insulating layer 130 may be implanted into source-drain area 123.

Figure 2D:
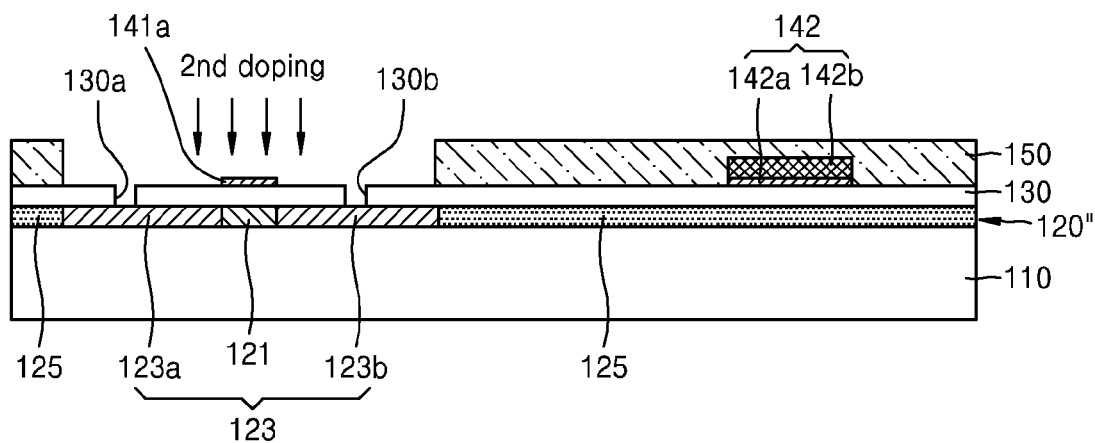

FIG. 2D depicts performance of a second doping process where upper gate electrode layer 141b may be removed prior to performance of channel doping.

Upper gate electrode layer 141b, which served as a mask to prevent channel area from becoming doped during the first doping process, may be removed by etching. Etching may include wet etching, dry etching, or a combination of these.

In the second doping process, interlayer insulating layer 150 may serve as a mask. First gate electrode layer 141a is formed in a thickness and/or of a material that allow dopant to pass through first gate electrode layer 141a. Also, gate insulating layer 130 may be formed of a material and in a thickness that allow dopant for channel area 121 to pass through gate insulating layer 130 during the second doping process. Therefore, dopant passing through gate insulating layer 130 in the second doping process thus penetrates into preliminary-semiconductor layer 120" to form channel area 121.

Channel area 121 has the channel doping concentration, and the channel doping concentration is substantially lower than the source-drain doping concentration (the doping concentration of source-drain area 123). Accordingly, the second doping process does not produce a substantially significant effect on the doping concentration of source-drain area 123.

The channel doping concentration may be about $10^2$ to about $10^4$ times lower than the source drain doping concentration.

Channel area 121 may be doped to adjust a threshold voltage of the thin film transistor TFT, and a first doping type and a second doping type may be identical to or different from each other.

A dopant activation annealing process may be performed subsequently. By performing the dopant activation annealing process, dopant implanted into semiconductor layer 120 may be dispersed and activated in semiconductor layer 120. The dopant activation annealing process may be performed by applying heat to semiconductor layer 120. For example, the activation annealing process may be performed by heating a substrate at about 400° C. to about 700° C. for 1 to 3 hours.

The first doping process, the second doping process, and the dopant activation annealing process form channel area 121 having the channel doping concentration, source-drain area 123 having the source-drain doping concentration, and semiconductor layer 120 having undoped area 125.

Figure 2E:
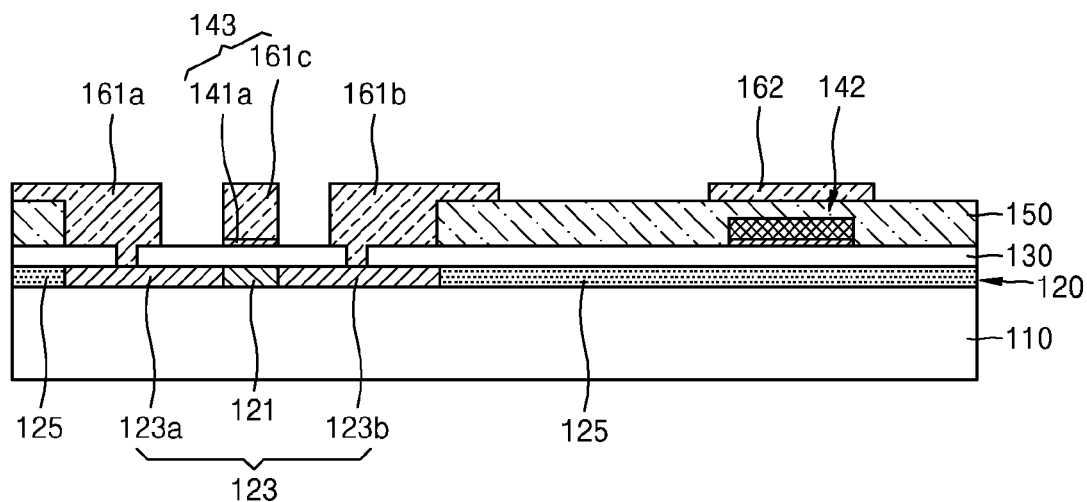

FIG. 2E depicts performance of a process forming source electrode 161a, drain electrode 161b, second gate electrode layer 161c and upper electrode 162 of the capacitor.

As discussed with regard to FIG. 2D, the activation annealing process is performed before source electrode 161a, drain electrode 161b, second gate electrode layer 161c and upper electrode 162 of the capacitor are formed, and thus electrodes 161a, 161b, 161c, and 162 are not oxidized and damaged by heat of the activation annealing process. In this regard, each of electrodes 161a, 161b, 161c, and 162 maintains a low resistance.

In the process depicted in FIG. 2E, a second conductive film (portions of which become the electrodes) may be formed on the whole surface of the substrate to cover first gate electrode layer 141a and interlayer insulating layer 150, and then a third mask process is performed so that source electrode 161a, drain electrode 161b, second gate electrode layer 161c, and upper electrode 162 of the capacitor are formed.

The second conductive film may be formed by using various deposition methods such as a sputtering, a CVD method or a PECVD.

The second conductive film may be formed including Al, Mo, Ti, Cu or the like. In some embodiments, the second conductive film may be formed in a stack structure of Ti/Cu, Mo/Al/Mo, Mo/AlGe/Mo, or Ti/Al/Ti. In some embodiments, the thickness of the second conductive film may be 1,000 Å or more.

In the third mask process, the second conductive film may be coated with a photoresist, and the photoresist is selectively exposed by using a third mask. A series of processes, such as developing, etching, and stripping or ashing are then performed. Etching may include wet etching, dry etching, or a combination of these.

Figure 2F:
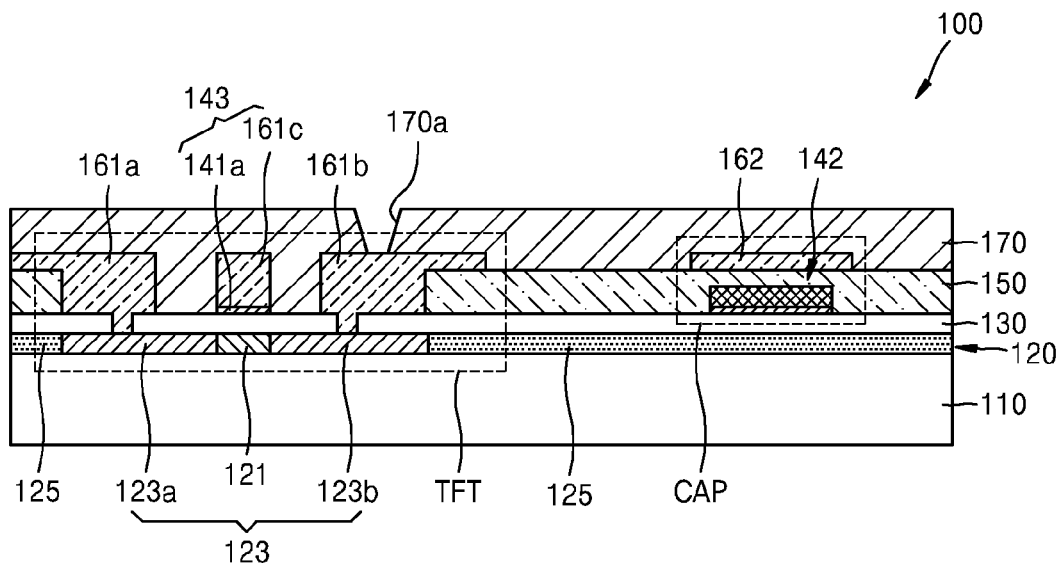

FIG. 2F depicts performance of a process forming planarization layer 170 to cover the thin film transistor TFT and the capacitor CAP.

Planarization layer 170 may be formed of an insulating material, and formed of an inorganic material or an organic material in a single-layer structure or in a stack structure including these materials.

In some embodiments, planarization layer 170 may be formed of an organic material. In a case in which planarization layer 170 is formed of an organic material, the thickness thereof may be greater than a case in which planarization layer 170 is formed of an inorganic material, and thus a parasitic capacitance may be reduced. In some embodiments, planarization layer 170 may be coated by a material such as polyacrylate, polyimides, or benzocyclobutene (BCB), and have a planar surface with a thickness of about 3 µm to about 5 µm. Planarization layer 170 may include opening 170a that exposes some portions of source electrode 161a or drain electrode 161b. Through opening 170a, the thin film transistor TFT may be electrically connected to the other devices or wirings.

Figure 3:
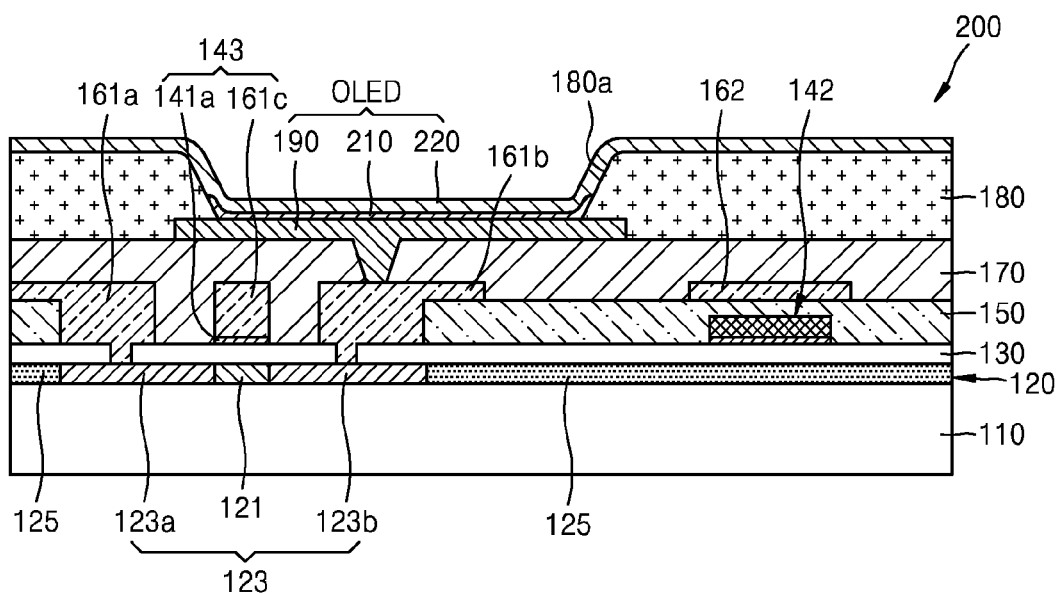
FIG. 3 is a cross sectional view of a thin film transistor array substrate according to one or more exemplary embodiments.

FIG. 3 is a cross sectional view of thin film transistor array substrate 200 according to one or more exemplary embodiments. Like reference numerals in FIG. 3 denote like elements in FIG. 1, and thus their description will be omitted here for brevity of description.

Referring to FIG. 3, thin film transistor array substrate 200 may further include a pixel electrode 190 on planarization layer 170, intermediate layer 210 including an organic emission layer, and an organic light-emitting device including an opposite electrode 220. Also, thin film transistor array substrate 200 may further include pixel defining layer 180.

Pixel electrode 190 is formed on planarization layer 170. Pixel electrode 190 may be electrically connected to drain electrode 161b while filling opening 170a of planarization layer 170. Pixel electrode 190 may be formed as a transparent electrode or a reflective electrode. If pixel electrode 190 is a transparent electrode, pixel electrode 190 may be formed of ITO, IZO, ZnO, or $In_2O_3$. If pixel electrode 190 is a reflective electrode, pixel electrode 190 may include a reflective film formed of Ag, Mg, Al, Pt, Pd, Au, Ni, Nd, Ir, Cr, or a combination thereof, and a transparent film formed of ITO, IZO, ZnO, or $In_2O_3$. In some embodiments, pixel electrode 190 may have an ITO/Ag/ITO structure.

Pixel defining layer 180 may define a pixel area and a non-pixel area. Pixel defining layer 180 may include opening 180a in the pixel area, and may be formed to cover the entire surface of planarization layer 170. Intermediate layer 210 may be formed in opening 180a, and thus opening 180a may be the substantial pixel area.

An organic light-emitting device OLED includes pixel electrode 190, intermediate layer 210, and opposite electrode 220. Holes and electrons provided from pixel electrode 190 and opposite electrode 220 of the organic light-emitting device OLED may be combined to generate light in the organic emission layer of intermediate layer 210.

Intermediate layer 210 may include the organic emission layer. In other embodiments, intermediate layer 210 may further include the organic emission layer, and at least one selected from a hole injection layer (HIL), a hole transport layer (HTL), an electron transport layer (ETL) and an electron injection layer (EIL). Intermediate layer 210 is not limited to aforementioned examples and may further include various functional layers.

Opposite electrode 220 may be formed on intermediate layer 210. Opposite electrode 220 forms an electric field with pixel electrode 190 to emit light from intermediate layer 210. Pixel electrode 190 may be patterned for each pixel, and opposite electrode 220 may be formed to apply the common voltage to all pixels.

Pixel electrode 190 and opposite electrode 220 may include a transparent electrode or a reflective electrode. Pixel electrode 190 may serve as an anode electrode whereas opposite electrode 220 may serve as a cathode electrode, but they are not limited thereto. For example, pixel electrode 190 may serve as a cathode electrode, and opposite electrode 220 may serve as an anode electrode.

Although only one organic light-emitting device OLED is illustrated in the figures, a display panel may include a plurality of organic light-emitting devices OLEDs. Each organic light-emitting device OLED may form an independent pixel, and such pixel may emit red, green, blue, or white light.

However, the current embodiment is not limited thereto. Intermediate layer 210 may be commonly formed on entire pixel electrode 190 regardless of positions of pixels. In this case, the organic emission layer may be formed by vertically stacking or combining a plurality of layers including respective light-emitting materials that emit red, green, and blue light. If the pixel may emit white light, lights may also be mixed to realize other colors. In this case, a color conversion layer for converting the emitted white light into a certain color light, or a color filter may be further included.

A protection layer (not shown) may be disposed on opposite electrode 220, and may cover and protect the organic light-emitting device OLED. The protection layer may use an inorganic insulating layer and/or an organic insulating layer.

Figure 4:
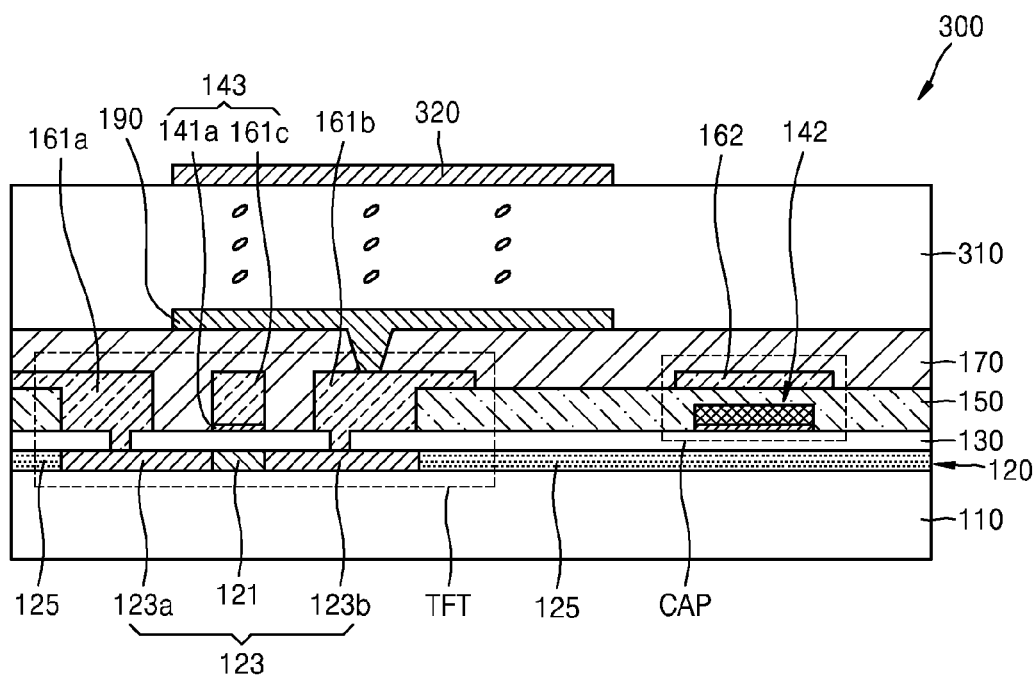
FIG. 4 is a cross sectional view of a thin film transistor array substrate according to one or more exemplary embodiments.

FIG. 4 is a cross-sectional view of thin film transistor array substrate 300 according to one or more exemplary embodiments. Like reference numerals in FIG. 4 denote like elements in FIGS. 1 and 3, and thus their description will be omitted here for brevity of description.

Thin film transistor array substrate 300 of FIG. 4 includes pixel electrode 190, an intermediate layer 310 including a liquid crystal, opposite electrode 320 and a color filter layer (not shown), which may be formed subsequent to the processed forming thin film transistor array substrate 100 of FIGS. 1 and 2F.

Pixel electrode 190 is formed on planarization layer 170. Pixel electrode 190 may be electrically connected to drain electrode 161b by filling opening 170a of planarization layer 170. Pixel electrode 190 may include a transparent electrode or a reflective electrode. In a case where pixel electrode 190 is formed as a transparent electrode, pixel electrode 190 may be formed of ITO, IZO, ZnO, or $In_2O_3$. In a case where pixel electrode 190 is formed as a reflective electrode, pixel electrode 190 may include a reflective film formed of Ag, Mg, Al, Pt, Pd, Au, Ni, Nd, Ir, Cr, or a compound thereof, and a transparent film formed of ITO, IZO, ZnO, or $In_2O_3$. In some embodiments, pixel electrode 190 may have an ITO/Ag/ITO structure.

Intermediate layer 310 may include the liquid crystal. An alignment of the liquid crystal in intermediate layer 310 may be changed according to an electric field generated by pixel electrode 190 and opposite electrode 320. Transmittance of light passing through intermediate layer 310 may be determined according to the alignment of the liquid crystal in intermediate layer 310.

Opposite electrode 320 is formed on intermediate layer 310. Opposite electrode 320 may be formed in order for a common voltage to be applied to each pixel. Opposite electrode 320 may be formed as various types including a plurality of slits.

A color filter layer (not shown) may be further formed on opposite electrode 320. The color filter layer may include a red, green, or blue filter depending on the pixels. The color filter layer may apply a color to light which is emitted from a backlight unit (not shown) disposed under thin film transistor array substrate 20 and passed through intermediate layer 310.

Although only one pixel is illustrated in FIG. 4, a display panel may include a plurality of pixels, as discussed above.

As described above, thin film transistor array substrates 100, 200, and 300 according to the embodiments of the present invention may be applied to organic light-emitting display apparatuses or liquid crystal display apparatuses, but are not limited thereto. Thin film transistor array substrates 100, 200, and 300 may be applied to various types of display apparatuses such as plasma display apparatuses and electrophoretic display apparatuses.

As described above, according to the one or more of the above embodiments of the present invention, a mask patterning process and a channel doping process of a semiconductor layer may be omitted during the manufacturing method for the thin film transistor array substrate. Therefore, by reducing the number of masks used during the process, the manufacturing cost may be reduced and the process may be simplified.

In addition, the electrode and wirings may be prevented from damage due to the dopant activation process, and thus low resistance electrodes and wirings may be realized. In addition, the gate electrode may be formed to be thick enough to prevent an IR-Drop.

It should be understood that the exemplary embodiments described therein should be considered in a descriptive sense only and not for purposes of limitation. Descriptions of features or aspects within each embodiment should typically be considered as available for other similar features or aspects in other embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array substrate, comprising:
a thin film transistor comprising:
a semiconductor layer comprising:
a channel area having a first doping concentration on a substrate;
a source-drain area disposed at opposite sides of the channel area and having a second doping concentration greater than the first doping concentration; and
a substantially undoped area extending from the source-drain area and having a doping concentration less than the first doping concentration;
a gate insulating layer disposed on the semiconductor layer;
a gate electrode disposed on the gate insulating layer and at least overlapping a portion of the channel area; and
a source electrode and a drain electrode, each insulated from the gate electrode and electrically connected to the source-drain area,
wherein the gate electrode comprises a first gate electrode layer and a second gate electrode layer thicker than the first gate electrode layer,
wherein the semiconductor layer is formed over an entire top surface of the substrate, and
wherein each area of the semiconductor layer having the second doping concentration contacts an area of the semiconductor layer having the first doping concentration and the substantially undoped area.

2. The thin film transistor array substrate of claim 1, further comprising:
a capacitor comprising a lower electrode and an upper electrode, a lower electrode disposed on the semiconductor layer in a region corresponding to the substantially undoped area; and
a capacitor comprising the lower electrode and an upper electrode insulated from the lower electrode,
wherein:
the lower electrode comprises a first electrode layer and a second electrode layer;
the first electrode layer has the same thickness as the first gate electrode layer; and
the second electrode layer is thinner than the second gate electrode layer.

3. A thin film transistor array substrate, comprising:
a thin film transistor comprising:
a semiconductor layer comprising:
a channel area having a first doping concentration on a substrate;
a source-drain area disposed at opposite sides of the channel area and having a second doping concentration greater than the first doping concentration; and
a substantially undoped area extending from the source-drain area and having a third doping concentration different from the first doping concentration;
a gate insulating layer disposed on the semiconductor layer;
a gate electrode disposed on the gate insulating layer and at least overlapping a portion of the channel area; and
a source electrode and a drain electrode, each insulated from the gate electrode and electrically connected to the source-drain area; and
a capacitor comprising a lower electrode and an upper electrode, the lower electrode disposed on the semiconductor layer in a region corresponding to the substantially undoped area,
wherein:
the lower electrode is disposed between the upper electrode and the semiconductor layer, the lower electrode comprising a first electrode layer and a second electrode layer;
the upper electrode is insulated from and overlaps at least a portion of the lower electrode;
the gate electrode comprises a first gate electrode layer and a second gate electrode layer thicker than the first gate electrode layer;
the first electrode layer and the first gate electrode layer comprise the same material;

the first electrode layer has the same thickness as the first gate electrode layer; and the second electrode layer is thinner than the second gate electrode layer.

4. The thin film transistor array substrate of claim 3, wherein the upper electrode comprises the same material as the source electrode or the drain electrode.

5. The thin film transistor array substrate of claim 3, wherein the first gate electrode layer comprises a transparent conductive material.

6. The thin film transistor array substrate of claim 3, wherein the thickness of the first gate electrode layer is in a range of about 300 Å to about 500 Å.

7. The thin film transistor array substrate of claim 3, further comprising a planarization layer covering the thin film transistor, the planarization layer comprising an opening exposing a portion of at least one of the source electrode or the drain electrode.

8. The thin film transistor array substrate of claim 3, further comprising:

a pixel electrode electrically connected to the source electrode or the drain electrode; an opposite electrode facing the pixel electrode; and an intermediate layer disposed between the opposite electrode and the pixel electrode, wherein the intermediate layer comprises an organic emission layer or a liquid crystal layer.

9. The thin film transistor array substrate of claim 3, wherein the second gate electrode layer comprises the same material as at least one of the source electrode and the drain electrode.

10. The thin film transistor array substrate of claim 3, wherein the first gate electrode layer is thinner than the lower electrode.

* * * * *